(12) United States Patent
Pfeuffer et al.

(10) Patent No.: US 8,040,133 B2
(45) Date of Patent: Oct. 18, 2011

(54) METHOD AND APPARATUS FOR DYNAMIC DISTORTION CORRECTION IN EPI MEASUREMENTS IN MEDICAL MAGNETIC RESONANCE IMAGING

(75) Inventors: Josef Pfeuffer, Kunreuth (DE); Markus Vogler, Rehau (DE)

(73) Assignee: Siemens Aktiengesellschaft, Munich (DE)

( * ) Notice: Subject to any disclaimer, the term of this patent is extended or adjusted under 35 U.S.C. 154(b) by 273 days.

(21) Appl. No.: 12/362,574

(22) Filed: Jan. 30, 2009

(65) Prior Publication Data

US 2009/0195247 A1 Aug. 6, 2009

(30) Foreign Application Priority Data

Jan. 31, 2008 (DE) .......................... 10 2008 007 048

(51) Int. Cl.
*G01V 3/00* (2006.01)

(52) U.S. Cl. ....................... 324/309; 324/307

(58) Field of Classification Search .......... 324/300–322; 600/407–445
See application file for complete search history.

(56) References Cited

U.S. PATENT DOCUMENTS

| | | | |
|---|---|---|---|
| 5,560,360 A * | 10/1996 | Filler et al. .................... 600/408 |
| 6,068,595 A * | 5/2000 | Miyazaki et al. ............. 600/410 |
| 6,275,038 B1 | 8/2001 | Harvey |
| 6,320,380 B1 * | 11/2001 | Wu et al. ........................ 324/309 |
| 6,548,796 B1 * | 4/2003 | Silvermintz et al. ........ 250/201.3 |
| 6,700,374 B1 | 3/2004 | Wu et al. |
| 6,728,568 B1 * | 4/2004 | Yatsui et al. ................... 600/410 |
| 6,980,001 B2 * | 12/2005 | Paley et al. .................... 324/318 |
| 7,019,523 B2 * | 3/2006 | Ikezaki ......................... 324/309 |
| 7,298,144 B2 * | 11/2007 | Reeder et al. ................ 324/307 |
| 7,469,159 B2 * | 12/2008 | DeYoe et al. ................. 600/411 |
| 2010/0213938 A1 * | 8/2010 | Jeong et al. ................... 324/309 |
| 2010/0260403 A1 * | 10/2010 | Takizawa et al. ............. 382/131 |

FOREIGN PATENT DOCUMENTS

DE 103 19 037 A1 11/2004

OTHER PUBLICATIONS

"A Technique for Accurate Magnetic Resonance Imaging in the Presence of Field Inhomogeneities," Chang et al., IEEE Trans. on Medical Imaging, vol. 11, No. 3 (1992) pp. 319-329.
"Correction for EPI Distortions Using Multi-Echo Gradient-Echo Imaging," Chen et al., Magnetic Resonance in Medicine, vol. 41 (1999) pp. 1205-1213.
"Correction for Geometric Distortion in Echo Planar Images from $B_0$ Field Variations," Jazzard et al., Magnetic Resonance in Medicine, vol. 34 (1995) pp. 65-73.
"An Evaluation of the Use of Magnetic Field Maps to Undistort Echo-Planar Images," Cusack et al., NeuroImage, vol. 18, (2003) pp. 127-142.
"EPI Distortion Correction From a Simultaneously Acquired Distortion Map Using TRAIL," Priest et al., J. Mag. Res. Imaging, vol. 23 (2006) pp. 597-603.
"Correction for Geometric Distortion and N/2 Ghosting in EPI by Phase Labeling for Additional Coordinate Encoding (PLACE)," Xiang et al., Magnetic Resonance in Medicine, vol. 57 (2007, pp. 731-741.

* cited by examiner

*Primary Examiner* — Brij Shrivastav
(74) *Attorney, Agent, or Firm* — Schiff Hardin LLP

(57) ABSTRACT

In a magnetic resonance tomography method and apparatus (MRT), as employed in medicine for examination of patients, for dynamic distortion correction in EPI measurements, image acquisitions are acquired that are adjacent in a periodic/alternating manner differ with regard to phase information, phase coding direction or with regard to the echo time, and based on this difference a field map and/or a displacement map is calculated with which at least one distorted result image is corrected.

11 Claims, 4 Drawing Sheets

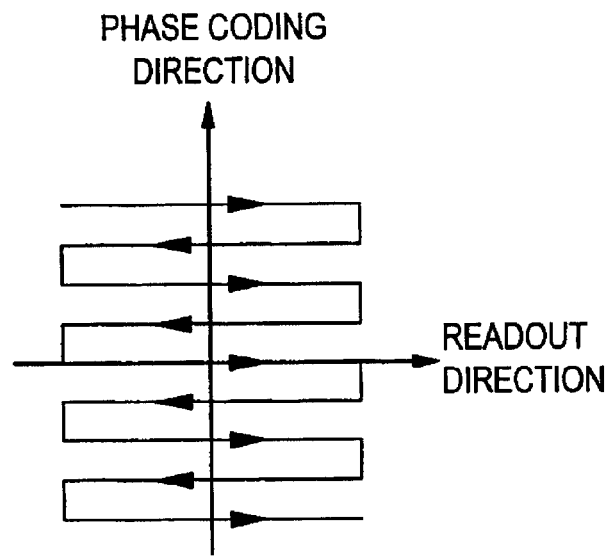
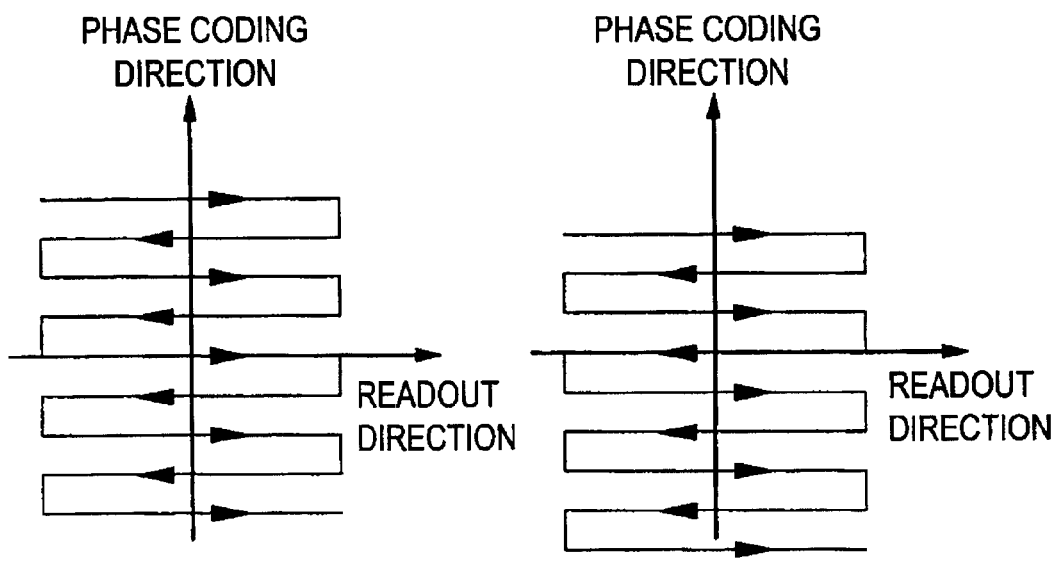

METHOD AND APPARATUS FOR DYNAMIC DISTORTION CORRECTION IN EPI MEASUREMENTS IN MEDICAL MAGNETIC RESONANCE IMAGING

BACKGROUND OF THE INVENTION

1. Field of the Invention

The present invention generally concerns magnetic resonance tomography (MRT) as employed in medicine for examination of patients. The present invention in particular relates to a method and apparatus to reduce distortions or deformations in the plug connection device that appear in the use of echoplanar imaging sequences (EPI sequences) and that significantly negatively affect the image quality (and therefore the diagnosis).

2. Description of the Prior Art

MRT is based on the physical phenomenon of nuclear magnetic resonance and has been successfully used in medicine and biophysics as an imaging method for over 15 years. In this examination method the subject is exposed to a strong, constant magnetic field. The nuclear spins of the atoms in the subject which were previously randomly oriented thereby align. Radio-frequency waves can now excite these "ordered" nuclear spins to a precession movement. This precession generates the actual measurement signal in MRT, which measurement signal is acquired by means of suitable acquisition coils. The measurement subject can be spatially coded in all three spatial directions via the use of inhomogeneous magnetic fields generated by gradient sub-coils.

In one method for generation of MRT images, a slice is initially selectively excited, for example in the z-direction. The coding of the spatial information in the slice ensues via a combined phase and frequency coding by means of two orthogonal gradient fields that, in the example of a slice excited in the z-direction, are generated in the x-direction and y-direction by the aforementioned gradient sub-coils. The imaging sequence is repeated M times for different values of the phase coding gradients (for example $G_P$), wherein the nuclear magnetic resonance signal is digitized and stored given each sequence pass in the presence of the readout gradient $G_R$. A number matrix (matrix in k-space) with N×M data points is obtained in this manner. An MR image of the considered slice with a resolution of N×M pixels can be directly reconstructed from this data set.

In imaging known as echoplanar imaging (EPI), multiple phase-coded echoes are used to fill the raw data matrix. The basic idea of this technique is to generate a series of echoes in the readout gradient ($G_R$) after a single (selective) RF excitation, which echoes are associated via a suitable modulation of the phase coding gradient ($G_P$) with different lines in the k-space plane.

One possible form of the echoplanar pulse sequence is shown in FIG. 1. After an excitation pulse and a refocusing pulse, multiple gradient echoes are generated via a sinusoidally oscillating frequency coding gradient in the readout direction and phase coding. The phase coding in this depiction ensues through small gradient pulses (blips) in the range of the zero crossing of the oscillating frequency coding gradient and leads in this manner to a meandering traversal of the spatial frequency matrix (k-matrix), as is shown in FIG. 2. It is thereby noted that, as an alternative to this, EPI can also be implemented as Cartesian EPI (blipped EPI), as non-Cartesian EPI (spiral EPI) or as a single-shot turbo-spin echo (TSE) readout train, for example.

In spite of many limitations, EPI sequences present a high clinical potential (particularly in functional imaging and in perfusion and diffusion measurements) since movement artifacts (for example due to breathing or pulsed movement of blood or cerebral fluid) can be drastically reduced due to the extremely short measurement time (MR image acquisition in less than 100 ms).

As stated, the reason for this is the fact that in EPI an entire 2D MR image is acquired with only a single excitation pulse. A scan direction with high readout speed (readout direction) and a scan direction with low readout speed (phase encoding direction), but results due to the wandering k-space sampling. Susceptibility artifacts which reflect the spatial inhomogeneity of the magnetic field in the image primarily occur in the plug connection device due to the low bandwidth resulting from this. The magnetic field inhomogeneity is essentially caused by the subject itself or, respectively, by the spatially changing susceptibilities inside the subject (inside the body). An example of this is the boundary surface in the nasotracheal area of a test subject between air and the skull or, respectively, the brain (air vs. bone/water).

The artifacts resulting from this are designated as a "static effect" because the adulterate the measurement result due to static inhomogeneities of the magnetic field (thus without gradient activities or patient movement).

In addition to the "static effects", there are also dynamic influences on the image quality of the measurement due to temporal susceptibility changes in the subject region. For example, a slight rotation of the patient during a functional MR measurement can already distinctly adulterate the measurement or, respectively, the measurement result.

Local magnetic field changes likewise result due to the breathing of the patient (due to the changing air quantity in the lungs) and his pulse beat (brain pulsation). These circumstances also lead to a degradation of the image quality.

While "static effects" according to the prior art can be corrected by a number of methods—some methods for this utilize field maps acquired in advance, other methods are based on the use of reference scans—the problem of an optimal time-resolved correction of "dynamic effects" is not yet solved. Furthermore, either it presently assumed that the initial magnetic field inhomogeneities remain constant during the entire MR experiment (however, this is not provided given in vivo measurements due to continuous patient breathing, pulse beat, possible position change or movement of the head itself and/or of extremities) or time-intensive prescan-based correction methods are used that, however, entail a significant extension of the total measurement time and thus lead to an additional stressing of the patient.

SUMMARY OF THE INVENTION

An object of the invention is to provide a method that enables a dynamic correction of geometric distortions in fast MR imaging (for example EPI or BOLD-EPI) with minimal loss of the time resolution given repeated measurements.

This object is achieved according to the present invention by a method for dynamic distortion correction in EPI measurements in medical magnetic resonance imaging, wherein that image acquisitions (image exposures) are acquired adjacent to one another in a periodic/alternating manner differ with regard to phase information, phase coding direction or with regard to the echo time, and based this difference, a field map or a displacement map is calculated with which at least one distorted result image is corrected.

According to the invention, the calculation of the field map or of the displacement map ensues with known methods (for example on the basis of the PLACE method (Phase Labeling for Additional Coordinate Encoding; PLACE: Offset in the Phase Coding Direction; Qing-San Xiang, Frank Q. Ye: Correction for geometric distortion and N/2 in EPI by phase labeling for additional coordinate encoding (PLACE). Magnetic Resonance in Medicine, 57(4): 731-741, 2007).

Other possible methods are, for example, the gradient reversal method which is based on an alternation of the phase coding direction (positive/negative) or on the exchange of phase coding and readout direction (Gradient Reversal: Umdrehung der Phasenkodierrichtung; Hsuan Chang, J. Michael Fitzpatrick: a technique for accurate magnetic resonance imaging in the presence of eld inhomogeneities. IEEE Trans. Med. Imaging, 11(3):319-329, 1992) or the field map-based echo time variation method (based on a shift of the echo time; Peter Jezzard, Robert S. Balaban: Correction for Geometric Distortion in Echo Planar Images from B0 Field Variations. Magnetic Resonance in Medicine, 34:65-73, 1995).

It is advantageous when the calculation of the displacement maps and/or the corrections ensue in real time and in parallel on an image processing computer.

In the PLACE method the offset is also advantageously selected so that this alternates symmetrically relative to the k-space center.

Furthermore, it is advantageous when the time displacement maps are filtered or modified with a statistical method in order to minimize fluctuations or time artifacts, for example.

In a similarly advantageous embodiment of the invention, the displacement maps are combined or averaged, wherein the averaging represents a global mean or a boxcar mean, for example.

Furthermore, it is advantageous when a new correction ensues only given significance relative to the preceding correction.

The above object also is achieved in accordance with the present invention by an apparatus that is configured to implement the method described above, as well as all embodiments described above.

The above object also is achieved in accordance with the present invention by a computer-readable medium encoded with programming instructions that is loadable into a computer or a processor that operates a magnetic resonance tomography apparatus, in order to cause the magnetic resonance tomography apparatus to be operated as described above in accordance with the inventive method, and all embodiments thereof.

BRIEF DESCRIPTION OF THE DRAWINGS

FIG. 3 shows an idealized wandering k-space sampling of an EPI sequence according to FIG. 1

FIG. 4 shows the k-space trajectories of two successive EPI measurements with -1 blip phase offset in the phase coding direction in the case of the PLACE method.

DESCRIPTION OF THE PREFERRED EMBODIMENTS

Figure 1:
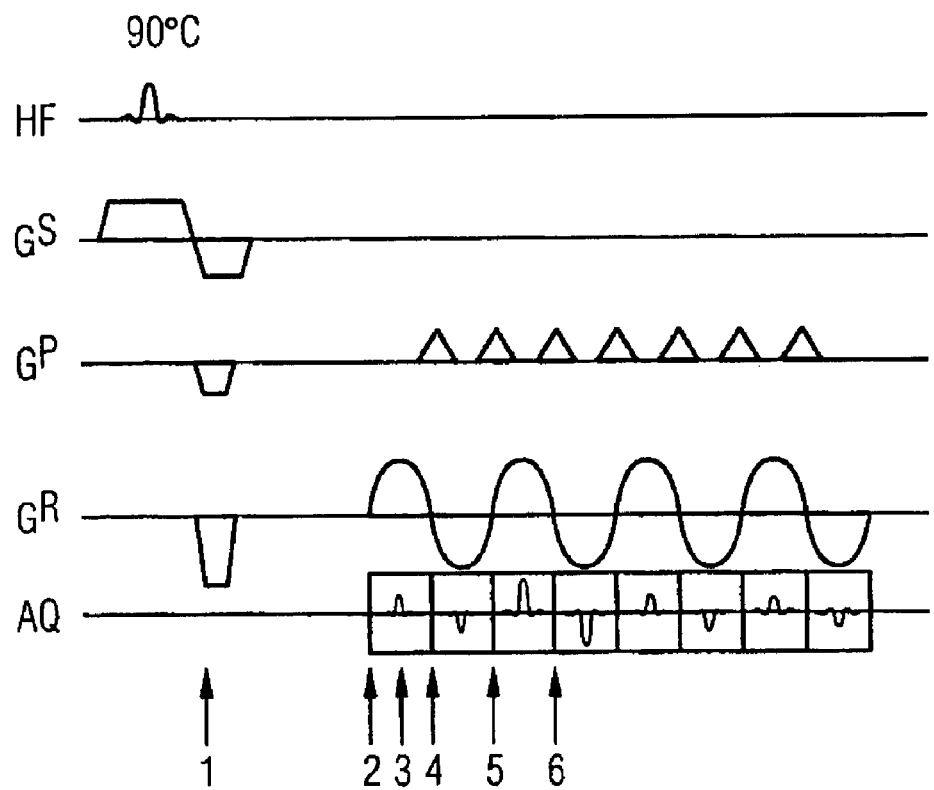
FIG. 1 is a sequence diagram of an EPI sequence.
Figure 2:
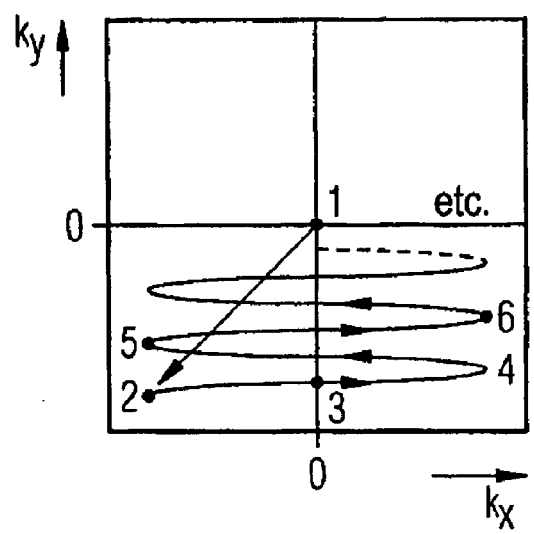
FIG. 2 schematically shows the real wandering sampling of the k-matrix given an EPI sequence according to FIG. 1.

The characteristic feature of EPI imaging is the alternating readout gradient pulse train in the data acquisition (FIG. 1) with which all rows of the k-space matrix are successively acquired in a serpentine manner (FIG. 2 or FIG. 3, idealized).

Figure 6A:
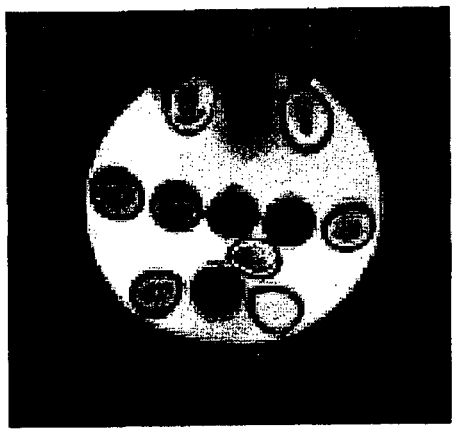
FIGS. 6A through 6D show EPI result images of a dynamic distortion correction according to the invention, using an MR phantom.
Figure 6C:
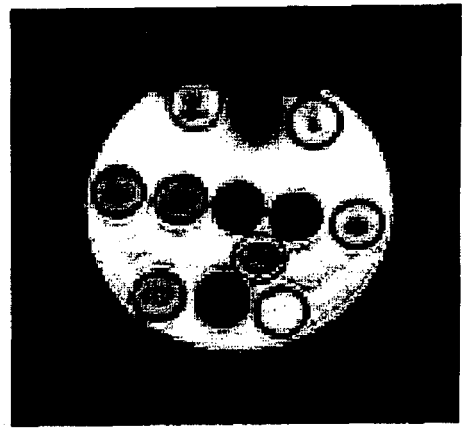

As already mentioned in the specification preamble, every dynamic influence of magnetic field susceptibilities inside the patient (breathing, movement of extremities, pulse beat, brain pulsation etc.) makes itself felt as clear image distortions/image deformations in the phase coding direction (see FIG. 6A).

In accordance with the present invention a distortion correction is specified in the phase coding direction that is minimized with regard to temporal resolution losses, which distortion correction is clearly superior to the time-intensive prescan-based methods.

200 to 300 images are typically acquired in a functional EPI measurement. The idea in application of the PLACE method is now to charge each repetition (each k-space sampling of an image measurement) with an offset in the phase coding direction. The offset of two adjacent (thus immediately following) repetitions should thereby differ by at least +1 or -1 blip offset. For example, two k-space trajectories that differ by a -1 blip offset in the phase coding direction are presented in FIG. 4.

FIG. 4 thus shows the section of an ER sequence with a 0,-1 series. Other alternating sequences can also be realized, for example sequences with the series -1,1,-1,1,-1,... or also -1,0,1,-1,0,1,... or 0,2,0, ...

Methods are now known from the prior art with which information about the inhomogeneities of the magnetic field inside the patient can be derived from two k-space trajectories that are adjacent to one another in the phase coding direction but displaced. What is known as a field map or what is known as a displacement map can in turn be calculated from this acquired information. While the field map presents magnetic field distortions or, respectively, magnetic field displacements in Hz, the displacement map contains the original positions (or, respectively, the offset relative to the original position) of the pixels distorted or displaced in the phase coding direction due to these magnetic field displacements or magnetic field inhomogeneities.

A method for displacement map generation is what known as the PLACE method Phase Labeling for Additional Coordinate Encoding). With this method, the pixel distortion (pixel deformation/pixel displacement) in the phase coding direction was calculated from the phase information of the offset k-space trajectories of two pre-interventional EPI images for testing purposes of static correction methods. Via application of the calculated displacement map to both images, each pixel could again be shifted to its original position, and the quality of the algorithm can be displayed.

The gradient reversal method is implemented as an additional method, for example. This alternates the phase coding direction between two input images —which leads to a compression or stretching —in order to generate a displacement map from this.

Additional methods for displacement map generation according to the prior art are based on the exchange of phase coding and readout direction. Methods for field map generation according to the prior art are based on a variation of the echo time.

In an exemplary embodiment of the method according to the invention, the present invention utilizes the PLACE method by (given an EPI measurement with multiple hundreds of images) calculating a displacement map from every adjacent, displaced image pair in k-space and applies this displacement map to a (distorted/deformed) image of the pair so this is deskewed, i.e. corrected.

Figure 5:
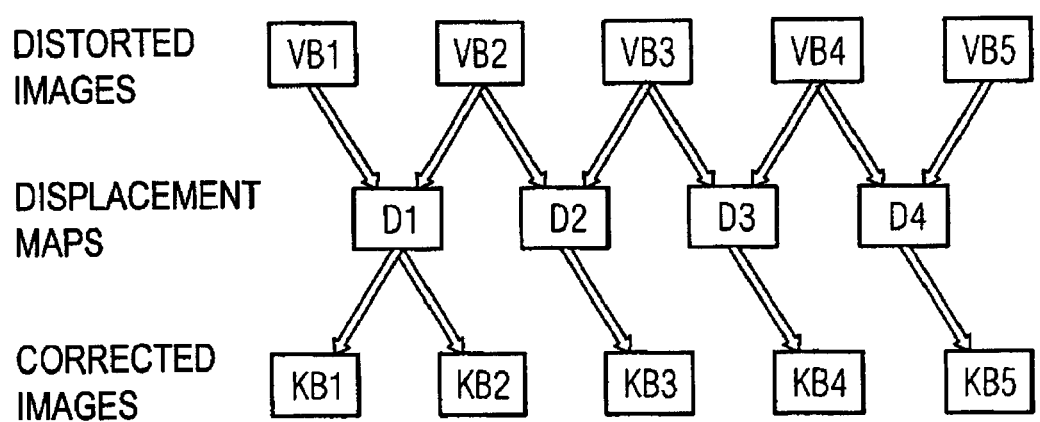
FIG. 5 shows a possible association scheme of acquired images, displacement maps and corrected images.

For better comprehension, this should be illustrated using a simple example in FIG. 5. Shown is a series of 5 distorted images VB1, VB2, VB3, VB4, VB5 that have been acquired displaced relative to one another in the phase coding direction in the framework of an EPI measurement via sequences alternating in k-space. The degree of the displacement is not apparent in FIG. 5. For example, a −1, 1, −1, 1, −1, 1, . . . series or a −1, 0, 1, −1, 0, 1, −1, 0, 1, . . . series or a 0, −1, 0, −1, . . . series etc. would be possible. 4 displacement maps D1, D2, D3, D4 can be calculated given an EPI measurement according to FIG. 5 with 5 repetitions.

In this example the calculation advantageously ensues with the PLACE algorithm:

The displacement map D1 is calculated from the distorted image VB1 and the distorted image VB2 by means of PLACE, the displacement map D2 is calculated from VB2 and VB3 etc. until the displacement map D4 has been generated.

The calculated displacement maps can in turn be immediately used for distortion correction of the distorted images VB1 through VB5, wherein (based on the combinatorial analysis) one of the displacement maps D1 through D4 must be applied to two adjacent, distorted images (for example, in FIG. 5 D1 is applied both to KB1 and KB2 without limitation of the generality). However, in this way 5 distortion-free corrected images KB1 through KB5 are again obtained in this manner. The arrows in the Figure symbolize the calculations.

Figure 6B:
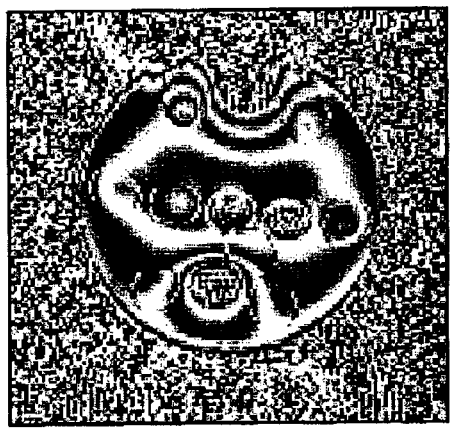
Figure 6D:
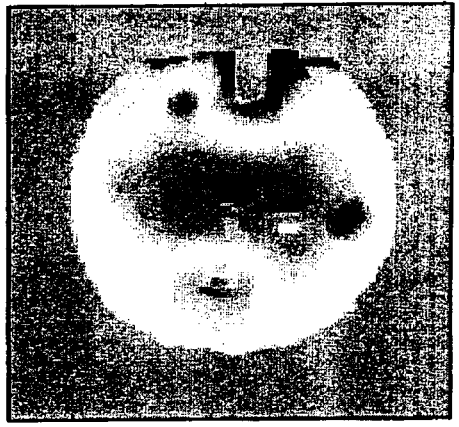

Result images of the individual method steps on a phantom [sic] are shown in FIGS. 6A through 6D. FIG. 6A shows a distinctly distorted output image VB1. FIG. 6B shows the phase image necessary for the calculation of the displacement map. A displacement map D1 is calculated (FIG. 6C) from two adjacent phase images on the basis of the PLACE algorithm, which displacement map D1 applied to VB1 yields a distinctly distortion-free, corrected image KB1 (FIG. 6D).

In summary, the method according to the invention represents a novel dynamic correction method. By a combination of an existing, known static distortion correction method (for example PLACE algorithm) with a specially adapted EPI sequence that, with regard to k-space, alternates displacement in the phase coding direction from acquisition to acquisition (in established periodicity), current displacement maps can be generated.

In the association scheme from FIG. 5, a displacement map (D2) is acquired from two respective, successive, distorted acquired EPI images (for example VB 2, VB 3). The displacement map (D2) is in turn used to correct a distorted image (VB3) from which (among others) this displacement map was generated.

The corrections are thus recalculated or continuously updated during the acquisition of additional EPI images and are dynamically applied in real time.

By contrast, in a present static correction according to the prior art only one displacement map is generated in total (via two prescans or two reference scans), which displacement map is then applied unchanged to all distorted EPI images of the entire measurement. Although static magnetic field inhomogeneities can be taken into account in this matter, magnetic field changes or, respectively, dynamic susceptibilities inside the patient cannot.

As an alternative to the real-time dynamic method, the correction can also be dynamically implemented offline as post-processing on an image computer or image processing computer. However, it can then be that a longer time must be waited for the result (output and display of the corrected images).

Various schemes for the combination of dynamic displacement maps are possible. A displacement map does not necessarily have to be individually applied; multiple displacement maps can also be advantageously combined, for example in groups (boxcar mean) or in their entirety (global mean).

Although the averaging over multiple displacement maps leads to a loss of temporal resolution, it has the advantage that severe spikes are avoided over time. For example, severe spikes (severe distortion differences) arise given a sudden rotation of the patient, which is why a displacement map for a time window containing such a movement would be unusable.

In order to ensure a certain (i.e. necessary) degree of robustness of the dynamic correction method, it can be advantageous to use a quality criterion which makes a decision about the significance of a correction in comparison to the preceding correction.

The advantage of a sequence symmetry in the alternation in the phase coding direction was already addressed. The advantage of a sequence series in which the outer k-space points are symmetrically alternated around the center (for example −1, +1, −1, +1, . . . ) is that the magnitude information (i.e. the intensity) in the image changes only marginally (the corrected images then have approximately the same intensity distribution). A counter-example for this is asymmetrical series 0, 2, 0, . . . or 0, −1, 0, −1, . . . , which can lead to unwanted, severe intensity differences of adjacent images (slight disruptions at sharp edges in one of the two adjacent images).

Lastly, the difficulties should be shown that it is necessary to overcome in order to configure a magnetic resonance tomography apparatus so that it is in the position to be able to implement the method according to the invention.

The primarily difficulty is initially to design a stable PLACE module and to robustly integrate this (in terms of programming) into the ICE program. The ICE (Engl.: "Image Calculation Environment" as a manufacturer-specific post-processing environment) is a software environment defining interfaces that is responsible for the process from image creation to image display.

It has been noted that the PLACE module (the PLACE algorithm) strongly reacts to image noise, and in fact even undesirably to noise outside of the actual image region. This noise that is internal but in particular outside of the image region must be detected via image processing and be masked [calculated] out.

In order to be able to implement the correction calculations as quickly as possible in real time, the PLACE algorithm must be designed and implemented so that all (but in particular adjacent) EPI sequences or their trajectories exhibit no dependencies whatsoever, and therefore all necessary image processing steps can be effectively parallelized. This enables extremely short calculation times since—due to the parallelization—every processor or, respectively, every core of each CPU of the MRT image computer is completely loaded, and therefore the calculation potential of the MRT apparatus is optimally utilized.

An additional, extremely complicated step was the intervention in the software of the sequence controller, with which the standard EPI sequence was changed so as to deliver (symmetrically) alternating displaced images.

In summary, overall a technically very demanding and time-consuming development operation was necessary in order to configure an MRT apparatus according to the prior art in terms of programming so that the implementation of the dynamic displacement correction method according to the invention is possible given EPI measurements.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for dynamic distortion correction of echo planar imaging (EPI) exposures in magnetic resonance imaging, comprising the steps of:
    operating a magnetic resonance data acquisition unit using an EPI sequence to acquire a plurality of images of an examination subject exhibiting movement that are adjacent to each other and that periodically alternatingly differ with regard to at least one characteristic selected from the group consisting of phase information, phase coding direction and echo time, said images exhibiting pixel distortion due to said movement;
    in a computerized processor, based on the periodically alternating difference, generating a plurality of continuously updated maps each selected from the group consisting of a field map and a displacement map for said adjacent images; and
    in said processor, dynamically correcting said pixel distortion by images from generating distortion-corrected said adjacent images using said maps, and making said distortion-corrected images available in electronic form at an output of said processor.

2. A method as claimed in claim 1 comprising calculating said map based on a method selected from the group consisting of the PLAC method, the gradient reversal method, and the echo time variation method.

3. A method as claimed in claim 1 comprising calculating said map in real time with acquisition of said images in an image processing computer.

4. A method as claimed in claim 1 comprising correcting a distortion that is symmetrically alternated around a center of k-space using the PLACE method.

5. A method as claimed in claim 1 comprising filtering said map using a statistical method to minimize fluctuations and/or temporal artifacts therein.

6. A method as claimed in claim 1 comprising combining the respective maps for the respective adjacent images.

7. A method as claimed in claim 6 comprising averaging said maps for the respective adjacent images.

8. A method as claimed in claim 7 comprising averaging said maps to obtain an average selected from the group consisting of a global mean and a box car mean.

9. A method as claimed in claim 1 comprising implementing a new distortion correction dependent on a preceding distortion correction.

10. A magnetic resonance imaging apparatus comprising:
    a magnetic resonance data acquisition device that implements an EPI sequence to acquire magnetic resonance data from an examination subject exhibiting movement, as a plurality of adjacent images that periodically alternatingly differ with regard to a characteristic selected from the group consisting of phase information, phase coding direction and echo time, said images exhibiting pixel distortion due to said movement; and
    a processor supplied with said images that calculates a map configured to calculate a plurality of continuously updated maps each selected from the group consisting of a field map and a displacement map for said adjacent images, and to dynamically correct said pixel distortion by generating distortion-free resulting images from said adjacent images using said map, and to make said distortion-free resulting images available in electronic formation output of said processor.

11. A non-transitory computer-readable storage medium encoded with programming instructions, said medium being loaded into a processor that is supplied with magnetic resonance images acquired adjacent to each other from a subject exhibiting movement, using an EPI sequence, that periodically alternatingly differ with regard to a characteristic selected from the group consisting of phase information, phase coding direction and echo time, said images exhibiting pixel distortion due to said movement, said programming instructions causing processor to:
    generate a plurality of maps each selected from the group consisting of difference map and a field map for said adjacent images;
    dynamically correct said pixel distortion in said at least adjacent images using said map, to obtain a distortion-free resulting images; and
    make said distortion-free resulting images available in electronic form at an output of said processor.

* * * * *